(12) United States Patent
Sumiyoshi

(10) Patent No.: US 10,741,384 B2
(45) Date of Patent: Aug. 11, 2020

(54) PROCESS OF FORMING SILICON NITRIDE FILM

(71) Applicant: SUMITOMO ELECTRIC INDUSTRIES, LTD., Osaka (JP)

(72) Inventor: Kazuhide Sumiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/146,906

(22) Filed: Sep. 28, 2018

(65) Prior Publication Data
US 2019/0103264 A1 Apr. 4, 2019

(30) Foreign Application Priority Data

Sep. 29, 2017 (JP) .................................. 2017-191009
May 24, 2018 (JP) .................................. 2018-099897

(51) Int. Cl.
*H01L 21/02* (2006.01)
*C23C 16/455* (2006.01)
(Continued)

(52) U.S. Cl.
CPC ........ *H01L 21/0217* (2013.01); *C23C 16/345* (2013.01); *C23C 16/45557* (2013.01);
(Continued)

(58) Field of Classification Search
CPC ............. H01L 21/0217; H01L 21/0228; H01L 21/02271; H01L 21/67109; C23C 16/345; C23C 16/45557
See application file for complete search history.

(56) References Cited

U.S. PATENT DOCUMENTS 6,573,178 B1 * 6/2003 Nakamura .......... C23C 16/4401
                                                    438/643
7,494,943 B2 * 2/2009 Noro .................... C23C 16/4405
                                                    257/E21.17
(Continued)

FOREIGN PATENT DOCUMENTS

JP       2007-227449        9/2007
JP     2007227449 A  *     9/2007
(Continued)

OTHER PUBLICATIONS

Chen, Kevin J. et al., "GaN-on-Si Power Technology: Devices and Applications", *IEEE Transactions on Electron Devices*, vol. 64, No. 3, pp. 779-795, Mar. 2017.
(Continued)

*Primary Examiner* — Zandra V Smith
*Assistant Examiner* — Jeremy J Joy
(74) *Attorney, Agent, or Firm* — Smith, Gambrell & Russell, LLP.

(57) ABSTRACT

A process of depositing a silicon nitride (SiN) film on a nitride semiconductor layer is disclosed. The process includes steps of: (a) loading an epitaxial substrate including the nitride semiconductor layer into a reaction furnace at a first temperature and converting an atmosphere in the furnace into nitrogen ($N_2$); (b) raising the temperature in the furnace to a second temperature while keeping pressure in the furnace at a first pressure higher than 30 kPa; (c) converting the atmosphere in the furnace to ammonia ($NH_3$) at the second temperature; and (d) beginning the deposition by supplying $SiH_2Cl_2$ as a source gas for silicon (Si) at a second pressure lower than 100 Pa. A feature of the process is that a time span from when the temperature in the furnace reaches the critical temperature to the supply of $SiH_2Cl_2$ is
(Continued)

shorter than 20 minutes, where the first pressure becomes the equilibrium pressure at the critical temperature.

14 Claims, 14 Drawing Sheets

(51) Int. Cl.
  *C23C 16/34*   (2006.01)
  *H01L 29/778*   (2006.01)
  *H01L 29/66*   (2006.01)
  *H01L 29/417*   (2006.01)
  *H01L 29/20*   (2006.01)
  *H01L 23/29*   (2006.01)
  *H01L 21/027*   (2006.01)
  *H01L 23/31*   (2006.01)
  *H01L 21/311*   (2006.01)

(52) U.S. Cl.
  CPC .. *H01L 21/02211* (2013.01); *H01L 21/02271* (2013.01); *H01L 23/291* (2013.01); *H01L 29/2003* (2013.01); *H01L 29/41766* (2013.01); *H01L 29/66462* (2013.01); *H01L 29/7787* (2013.01); *H01L 21/0254* (2013.01); *H01L 21/0262* (2013.01); *H01L 21/0274* (2013.01); *H01L 21/02378* (2013.01); *H01L 21/31116* (2013.01); *H01L 21/31144* (2013.01); *H01L 23/3171* (2013.01)

(56) References Cited

U.S. PATENT DOCUMENTS

| | | | | |
|---|---|---|---|---|
| 7,615,163 B2 * | 11/2009 | Tamura | ................ | B08B 7/0035 216/63 |
| 9,920,424 B2 * | 3/2018 | Goto | ................ | C23C 16/4405 |
| 2002/0024118 A1 * | 2/2002 | Okoshi | ................ | C23C 16/345 257/649 |
| 2002/0127828 A1 * | 9/2002 | Suzuki | ................ | C23C 16/463 438/488 |
| 2004/0014330 A1 * | 1/2004 | Ku | ................ | H01L 21/02164 438/769 |
| 2005/0245099 A1 * | 11/2005 | Endo | ................ | B08B 7/0035 438/785 |
| 2006/0141782 A1 * | 6/2006 | Hasebe | ................ | C23C 16/4408 438/680 |
| 2006/0213539 A1 * | 9/2006 | Hasebe | ................ | C23C 16/4404 134/22.1 |
| 2008/0003362 A1 * | 1/2008 | Nodera | ................ | C23C 16/4404 427/255.28 |
| 2008/0282976 A1 * | 11/2008 | Okada | ................ | B08B 5/00 118/696 |
| 2009/0110824 A1 * | 4/2009 | Takenaga | ................ | C23C 16/481 427/248.1 |
| 2010/0167541 A1 * | 7/2010 | Kato | ................ | C23C 16/345 438/680 |
| 2013/0083568 A1 | 4/2013 | Makiyama et al. | | |
| 2013/0149874 A1 | 6/2013 | Hirose et al. | | |
| 2013/0153923 A1 | 6/2013 | Decoutere | | |
| 2014/0235067 A1 | 8/2014 | Shimamoto et al. | | |
| 2015/0235834 A1 | 8/2015 | Han et al. | | |
| 2018/0175150 A1 | 6/2018 | Mauder et al. | | |

FOREIGN PATENT DOCUMENTS

| | | |
|---|---|---|
| JP | 2013-77621 | 4/2013 |
| JP | 2013-123047 | 6/2013 |

OTHER PUBLICATIONS

U.S. Appl. No. 16/210,773, filed Dec. 5, 2018, Sumiyoshi.

* cited by examiner

PROCESS OF FORMING SILICON NITRIDE FILM

CROSS REFERENCE TO RELATED APPLICATIONS

The present application is based on and claims the benefit of priority of Japanese Patent Applications No. JP-2017-191009, filed on Sep. 29, 2017, and JP-2018-099897 filed on May 24, 2018, the entire contents of which are incorporated herein by references.

TECHNICAL FIELD

1. Field of Invention

The present invention relates to a process of forming a passivation film made of silicon nitride (SiN), in particular, a process of forming the SiN film for a nitride semiconductor device.

BACKGROUND

2. Background Arts

Japanese Patents laid open Nos. JP-2013-077621A and JP-2013-123047; have disclosed semiconductor device types of high electron mobility transistors (HEMT), A HEMT disclosed in the former patent document provides, on a substrate made of silicon carbide (SiC), semiconductor layers made of compound semiconductor materials and an SiN passivation film covering the semiconductor layers. The SiN passivation film disclosed therein provides an opening. A gate electrode is formed so as to be in contact with the semiconductor layers through the opening. That is, the gate electrode fills the opening. The SiN passivation film disclosed therein is formed by a technique called plasma assisted chemical vapor deposition (p-CVD) technique.

Another HEMT disclosed in the latter patent document provides a semiconductor stack formed on a substrate, where the semiconductor stack includes nitride semiconductor layers. The semiconductor stack in a top thereof is covered with an SiN passivation film, exactly, a passivation film made of $Si_3N_4$ deposited by, what is called, low pressure chemical vapor deposition (LPCVD) technique at a growth temperature higher than 550° C., preferably higher than 700° C.

An electron device made of nitride semiconductor materials, such as gallium nitride (GaN), has become very popular in the field. Such an electron device often implements a passivation film made of inorganic material containing silicon (Si), typically silicon nitride (SiN) in order to protect a surface of the nitride semiconductor layer physically and chemically. An SiN film may be formed by, for instance, the p-CVD technique and/or sputtering using electron cyclotron resonance (ECR) and so on, where those techniques may form an SiN film at relatively lower temperatures. The p-CVD and/or the ECR sputtering possibly induce damages of the surface of the nitride semiconductor layer.

Another technique to form an SiN film on a semiconductor material has been known as the LPCVD technique in the field of a semiconductor manufacturing process, where the LPCVD technique forms an SiN film with satisfactory quality at relatively higher temperature and lower pressure. The LPCVD technique has been very popular in a manufacturing process for semiconductor device primarily made of silicon (Si) because of enhanced temperature tolerance inherently attributed to Si material. In a case where the LPCVD technique becomes applicable to an electron device made of nitride semiconductor materials, such a device potentially shows attractive performances.

However, nitrogen atoms contained in a nitride semiconductor material are easily dissolved therefrom when a nitride semiconductor material is set under conditions of a high temperature and a low pressure, which degrades surface quality of the nitride semiconductor material. Moreover, di-chloro-silane ($SiH_2Cl_2$) is preferable as a source material for silicon (Si) in the LPCVD technique in order to enhance uniformity of an SiN film; however, chlorine (Cl) contained in di-chloro-silane is known as an element to etch a nitride semiconductor material, which may further degrade the quality of the surface of the nitride semiconductor material.

SUMMARY

The invention relates to a process of depositing a silicon nitride (SiN) film on a nitride semiconductor layer. The process comprises steps of: (a) loading an epitaxial substrate that includes the nitride semiconductor layer within a furnace at a first temperature lower than 500° C.; (b) converting an atmosphere in the furnace from air to nitrogen ($N_2$) and setting a pressure in a first pressure that is higher than 30 kPa; (c) raising a temperature to a second temperature that is higher than 750° C. as keeping the pressure in the first pressure; (d) converting the atmosphere in the furnace from nitrogen ($N_2$) to ammonia ($NH_3$) within 20 minutes; (e) setting the pressure in the furnace in a second pressure lower than 100 Pa; and (f) depositing the SiN film by supplying di-chloro-silane ($SiH_2Cl_2$) and ammonia ($NH_3$).

Another aspect of the process according to the present invention has features that a step (c) of raising the temperature and a step (d) of converting the atmosphere to ammonia ($NH_3$) sets an elapsed time to be shorter than 60 minutes, where the elapsed time is measured from an instant when the temperature reaches a critical temperature $T_C$ defined by an equation:

$$10^3 \cdot A/T_C + B = \log_{10}(P/C),$$

to a beginning of the deposition, where P is the first pressure in a unit of Pascal (Pa), $T_C$ is the critical temperature in the unit of Kelvin (K), and A to C are −10.1 (K), 12.5, and 1.00 Pa, respectively.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, embodiment according to the present invention will be described as referring to accompanying drawings. In the description of the drawings, numerals and symbols same with or similar to each other will refer to elements same with or similar to each other without duplicating explanations. It is noted that the present invention is not restricted to the embodiment, and has a scope defined in claims attached hereto and all modifications and changes within the scope and equivalents thereto.

First Embodiment

Figure 1:
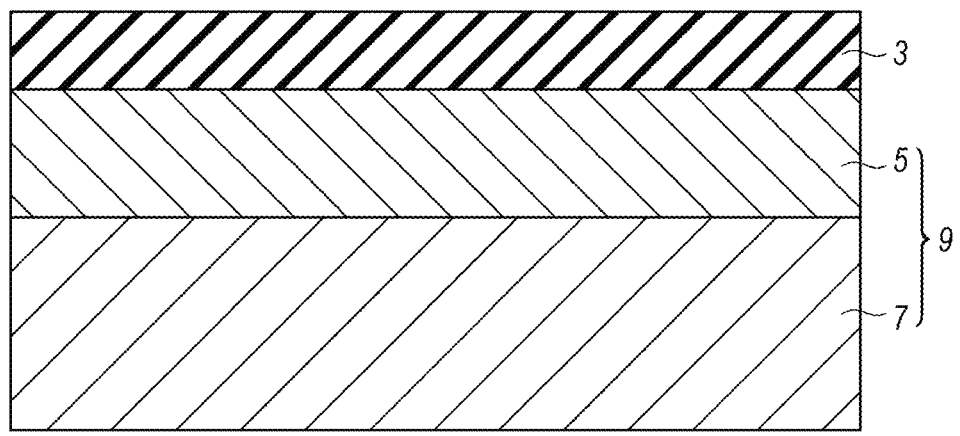
FIG. 1 is a cross sectional view of a passivation film made of silicon nitride (SiN) provided on an epitaxial substrate according to the first embodiment of the present invention.

FIG. 1 is a cross sectional view of a passivation film 3 made of silicon nitride (SiN) provided on an epitaxial substrate 9 that includes a substrate 7 and a nitride semiconductor layer 5. The SiN passivation film 3 may be formed by a low pressure chemical vapor deposition (LPCVD) technique. The nitride semiconductor layer 5 may be epitaxially grown on the substrate 7 that is made of, for instance, silicon carbide (SiC), sapphire ($Al_2O_3$), gallium nitride (GaN), silicon (Si) and so on. The nitride semiconductor layer 5 may include one or more layers including a GaN layer, an aluminum gallium nitride (AlGaN) layer, aluminum nitride (AlN) layer, and so on.

Figure 2:
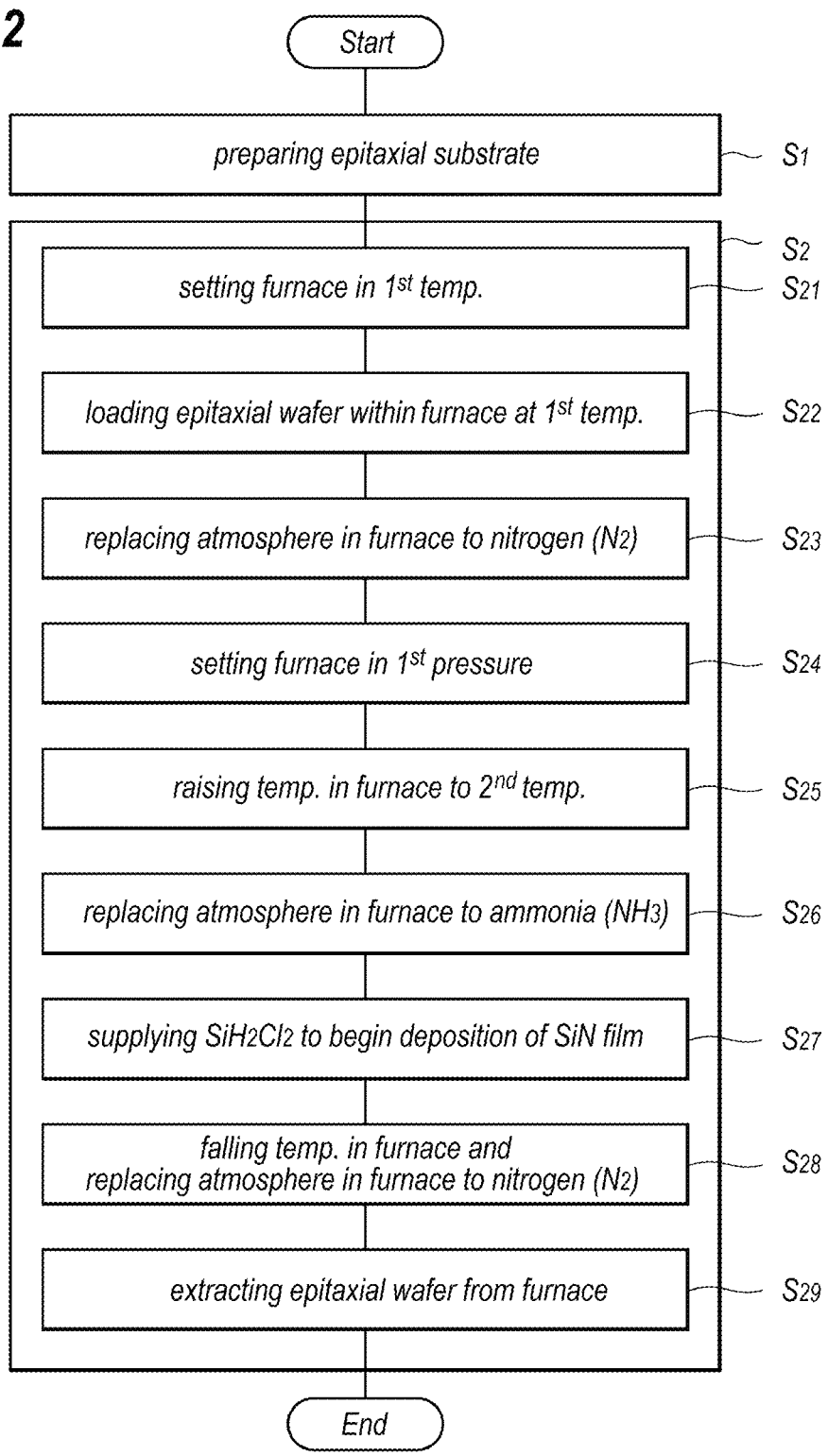
FIG. 2 shows a flow chart of a process of forming the SiN passivation film.
Figure 3:
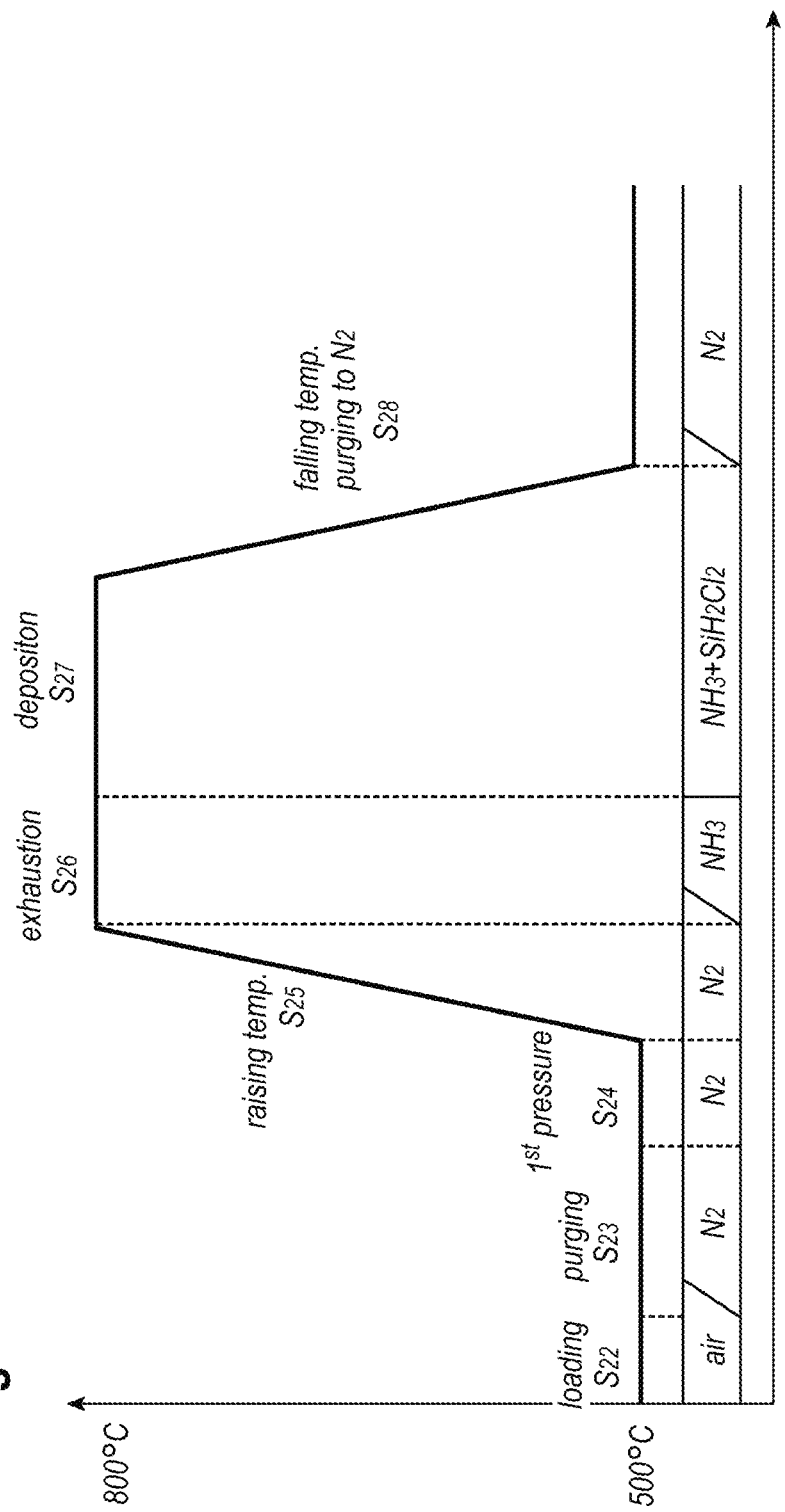
FIG. 3 shows a temperature profile and an atmosphere in a furnace for forming the SiN passivation film by the LPCVD technique.

FIG. 2 shows a flow chart of a process of forming the SiN passivation film 3. The epitaxial substrate 9 is first prepared at step S1 by epitaxially growing the nitride semiconductor layer 5 on the substrate 7 by the MOCVD (metal organic chemical vapor deposition) technique. Then, the SiN passivation film 3 is deposited on the epitaxial substrate 9 at step S2 which is described in detail referring to FIG. 2 and FIG. 3, where FIG. 3 shows a temperature profile in the furnace and sequence for supplying source gases within the furnace.

The process first sets at step S21 the temperature in the furnace to be lower than 500° C., preferably lower than 300° C., which will be called as the first temperature of the loading temperature $T_{LOAD}$, where the present embodiment sets the loading temperature to be 500° C. After the temperature in the furnace stabilizes at the loading temperature $T_{LOAD}$ described above, the epitaxial substrate 9 may be loaded within the furnace under an air atmosphere at step S22. Then, the furnace in the atmosphere thereof may be converted to nitrogen ($N_2$) by iterating exhaustion of the furnace and introduction of nitrogen ($N_2$) at step S23, which is sometimes called as a cycle purging.

After completion of the cycle purging, the furnace in a pressure thereof is set to be a first pressure that is higher than 3 kPa as step S24. The first pressure may be lower than 100 kPa, which is almost the air pressure. The present embodiment sets the first pressure to be 30 kPa. Thereafter, the furnace including supply routes for source gases is checked in an air-tightness thereof. Specifically, exhausting the furnace then isolating the furnace air-tightly from an outside, the pressure is checked whether a change, or an increment thereof, is observed or not. Thereafter, the temperature in the furnace is raised to a second temperature that is higher than 700° C. as maintaining the pressure in the furnace to be the first pressure at step S25, where the second temperature is often equal to a deposition temperature for the SiN passivation film. A rising rate of the temperature is preferably faster as possible, for instance, around 10° C./min or greater. The present embodiment raises the furnace temperature to 800° C. from 500° C. within 10 minutes. The second temperature, namely, the deposition temperature, is preferably higher than 800° C. but lower than 900° C.

Thereafter, the furnace is exhausted to replace the atmosphere thereof from nitrogen ($N_2$) to ammonia ($NH_3$), at step S26. The furnace is first exhausted to be a pressure from the first pressure to a second pressure lower than the first pressure. Specifically, the second pressure is preferably lower than 20 Pa, or further preferably lower than 2 Pa but higher than 1 Pa. The present embodiment exhausts the furnace to the pressure of 2 Pa; then introduces ammonia ($NH_3$). The exhaustion in the furnace and the introduction of $NH_3$ are iterated several times. During the conversion of the atmosphere from nitrogen ($N_2$) to ammonia ($NH_3$) at the second temperature; the surface of the nitride semiconductor layer 5 is exposed in a low pressure, for instance, lower than 10 Pa, preferably short as possible, for instance, an accumulated time for exposing the surface of the nitride semiconductor layer 5 in a low pressure is preferably shorter than 20 minutes, further preferably shorter than 10 minutes.

After the last exhaustion, the process introduces both $NH_3$ and di-chloro-silane ($SiCl_2H_2$) within the furnace at the same time to begin the deposition of the SiN passivation film 3 at step S27. The step S27 may set supply amounts of $NH_3$ and $SiH_2Cl_2$ even. For instance, the flow rates of $NH_3$ and $SiH_2Cl_2$ may be each 100 sccm, where 1 sccm is a flow rate at 0° C. under 1 atm.

After the SiN passivation film 3 is deposited with a designed thickness, the process cuts the supply of di-chloro-silane ($SiH_2Cl_2$) to change the atmosphere in the furnace to ammonia ($NH_3$). Thereafter, the temperature in the furnace is fallen down to a temperature lower than the second temperature, for instance, 700° C. Then, the atmosphere in the furnace is converted to nitrogen $N_2$ by iterating the exhaustion and the introduction of $N_2$ at step S28. The iteration above is repeated until di-chloro-silane ($SiH_2Cl_2$)

or chlorine ($Cl_2$) becomes undetectable. Finally, the epitaxial substrate 9 with the SiN passivation film 3 is brought out from the furnace at step S29.

The process thus described purges ammonia ($NH_3$) and di-chloro-silane ($SiH_2Cl_2$) after the temperature is fallen. In an alternative, the purge of the source gases may be carried out just after the interruption of di-chloro-silane ($SiH_2Cl_2$) at the second temperature.

In such a case, the temperature is fallen to a lower temperature, for instance, 500° C., as the furnace is maintained in nitrogen ($N_2$) atmosphere.

Figure 4:
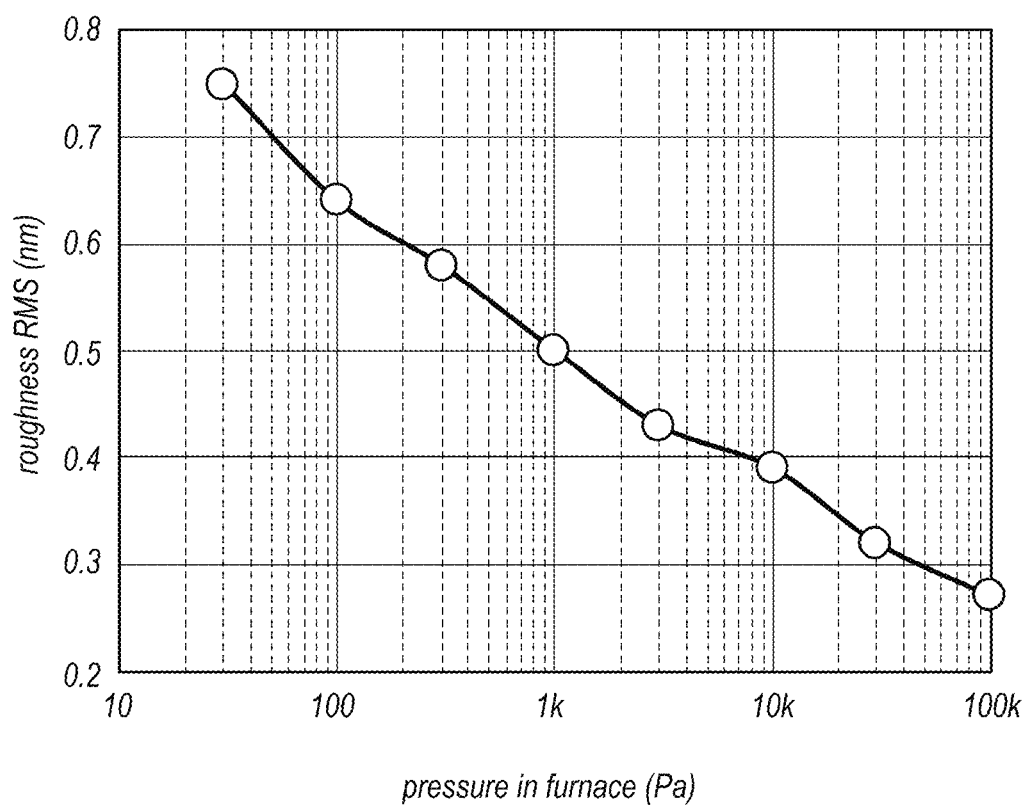
FIG. 4 shows surface roughness of a nitride semiconductor layer covered with the SiN passivation film against a pressure in the furnace during a period for raising a temperature, where the surface roughness is measured by a root-mean-square (RMS)

Advantages of the process according to the embodiment will be described. In step S21 above described, the furnace in the temperature thereof is raised to the deposition temperature under relatively higher pressure, for instance, higher than 30 kPa. FIG. 4 shows a surface roughness of the nitride semiconductor layer 5 covered with the SiN passivation film 3 formed by the LPCVD technique against a pressure in the furnace during the temperature thereof is raised, where the roughness is measured through a root-mean-square (RMS).

The RMS were measured by inspecting the surface of the nitride semiconductor layer 5 with an atomic force microscope (AFM) after removing the deposited SiN film 3 by fluoric acid (HF). The loading temperature $T_{LOAD}$ was set to be 400° C. Referring to FIG. 4, the surface roughness decreases, or the surface quality thereof enhances, as the pressure in the furnace during the temperature rise increases. For instance, the pressure greater than 30 kPa lowers the RMS values of the surface becomes smaller than 0.32 nm; and the pressure greater than 100 kPa may lower the surface RMS value to be 0.27 nm.

Figure 5:
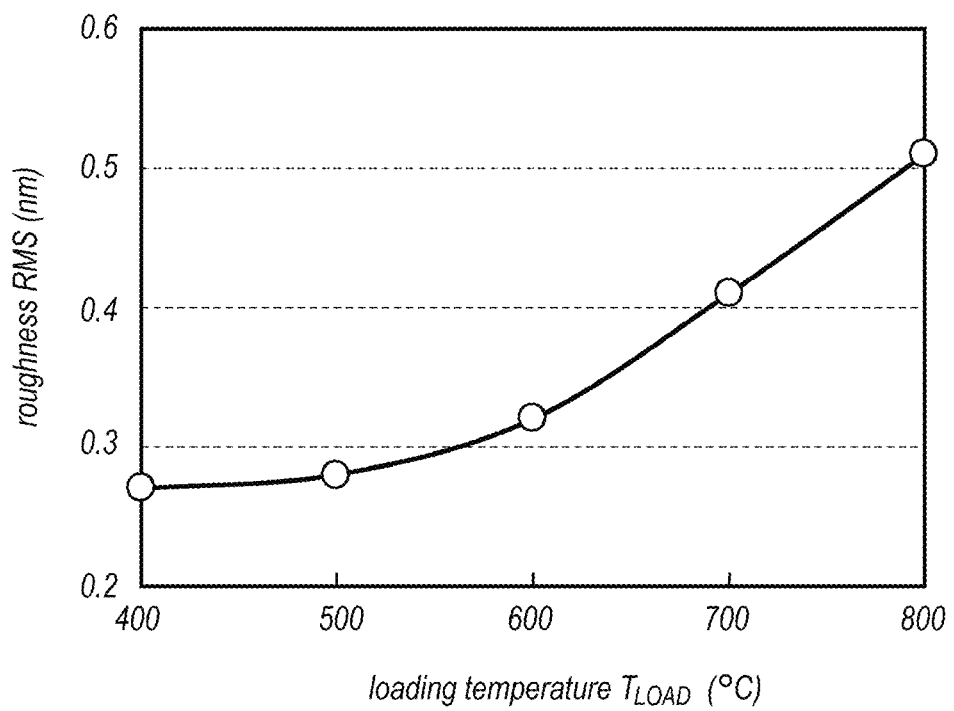
FIG. 5 shows surface roughness of the nitride semiconductor layer against a loading temperature $T_{LOAD}$ at which an epitaxial substrate is loaded within the furnace.

The step S21 shown in FIG. 2 sets the loading temperature $T_{LOAD}$ at which the epitaxial substrate 9 is loaded within the furnace to be lower than 500° C. FIG. 5 shows the surface roughness RMS against the loading temperature $T_{LOAD}$, where the pressure during the temperature rise of the furnace is set to be 100 kPa, namely, almost the air pressure, and an elapsed time from the first exhaustion of the furnace to the beginning of the deposition, during which the epitaxial substrate 9 is exposed in a high temperature and a low pressure, is set to be 5 minutes.

Referring to FIG. 5, the surface roughness monotonically decreases as the loading temperature $T_{LOAD}$ lowers. The loading temperature $T_{LOAD}$ lower than 500° C., the surface roughness RMS becomes 0.28 nm. Moreover, the loading temperature $T_{LOAD}$ becomes around 400° C., the surface roughness RMS becomes 0.27 nm. Also, the embodiment preforms the leak check at the first temperature, namely, the loading temperature $T_{LOAD}$; accordingly, the present sequence may shorten the elapsed time for the epitaxial substrate 9 to be exposed under the conditions of a high temperature and a low pressure, that is, the period from the first exhaustion of the furnace for the conversion of the atmosphere in the furnace to the beginning of the deposition.

Figure 6:
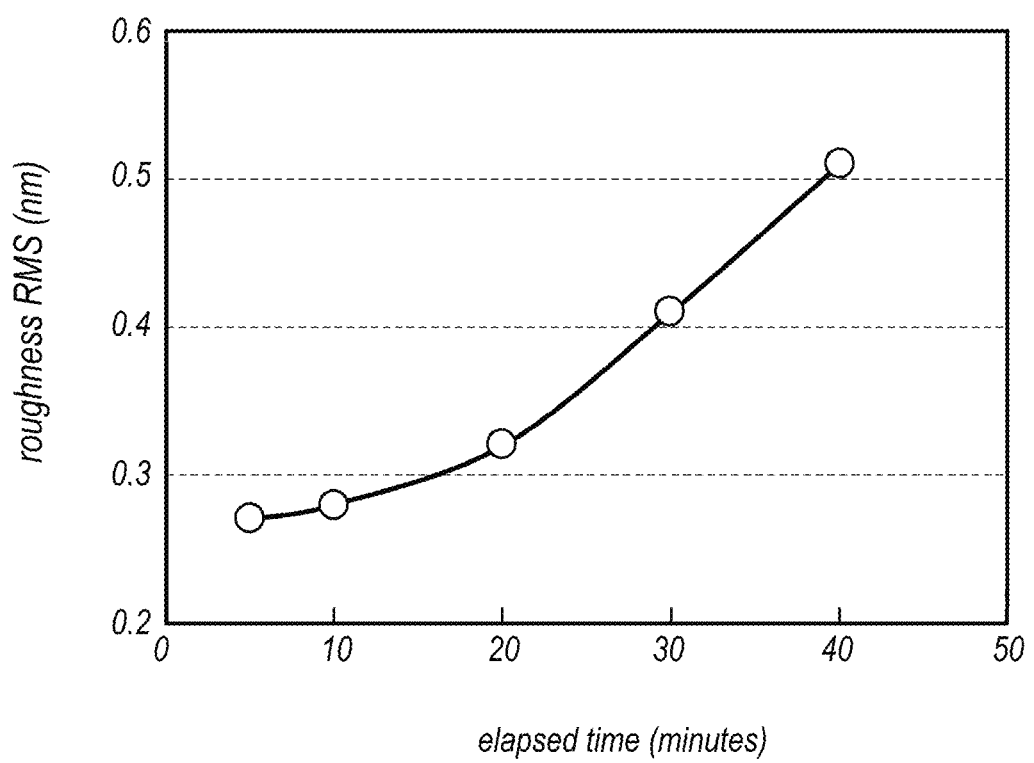
FIG. 6 shows surface roughness against an elapsed time from the first exhaustion of the furnace to the supply of di-chloro-silane ($SiH_2Cl_2$)

FIG. 6 shows the surface roughness RMS against the elapsed time from the first exhaustion for the conversion of the atmosphere to the beginning of the deposition, namely, an instant of supplying di-chloro-silane ($SiH_2Cl_2$), which corresponds to a time for the epitaxial substrate 9 to be exposed under the conditions of a high temperature and a low pressure. Practically, the exhaustion and the supply of ammonia ($NH_3$) are iterated several times, the time for the epitaxial substrate 9 to be exposed under the conditions of a high temperature and a low pressure becomes shorter than a period from the first exhaustion to the beginning of the deposition.

Referring to FIG. 6, the surface roughness RMS of the epitaxial substrate 9 gradually and monotonically lowers as the elapsed time becomes shorter. The surface roughness RMS becomes around 0.3 nm when the elapsed time becomes shorter than 20 minutes. Assuming that an acceptable surface roughness RMS is limited to be smaller than 0.35, the elapsed time for the epitaxial substrate 9 to be exposed in those conditions is preferably shorter than 20 minutes.

Second Embodiment

Figure 7:
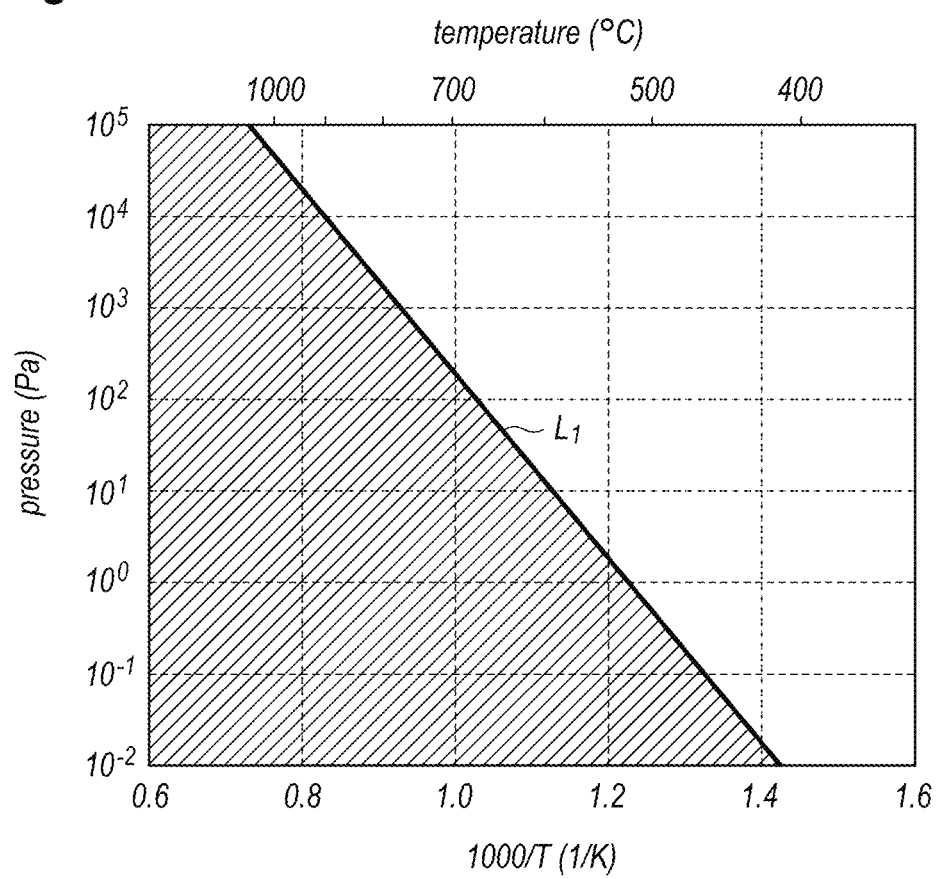
FIG. 7 shows a relation of an equilibrium pressure of nitrogen ($N_2$) against a temperature.
Figure 8:
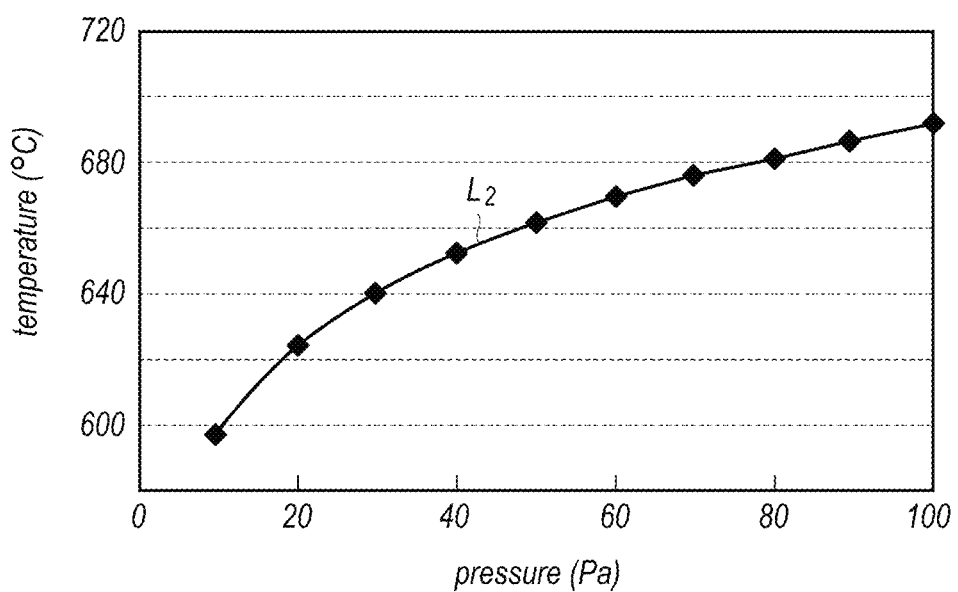
FIG. 8 shows a relation of the temperature in a unit of Celsius against the equilibrium pressure of $N_2$ in a unit of Pascal.

The elapsed time to be exposed in those severe conditions will be further investigated. During the process thus described from the step S25 to the step S26, namely, during an instant when the epitaxial substrate 9 is placed under conditions of a high temperature and a low pressure, nitrogen ($N_2$) may be easily dissolved from the surface of the epitaxial substrate 9, which degrades the surface quality. In order to suppress the dissociation of nitrogen ($N_2$), the embodiment according to the present invention begins the deposition of the SiN passivation film 3, or the conversion of the atmosphere to ammonia ($NH_3$) at an instant to be described below. FIG. 7 shows a pressure of nitrogen ($N_2$) against a temperature T, where the horizontal axis denotes a reciprocal of an absolute temperature (1/T), while, the vertical axis corresponds to the pressure in the unit of pascal (Pa). A linear line L1 corresponds to the equilibrium pressure of nitrogen. The dissociation of nitrogen from the surface of the epitaxial substrate 9 may be accelerated under conditions of the temperature and the pressure fallen in a hatched area in FIG. 7. FIG. 8 also shows a relation of the temperature in a unit of Celsius against the pressure of nitrogen ($N_2$) in a unit of Pascal, where a curve L2 corresponds to the linear behavior shown in FIG. 7.

An equation (1) below corresponds to the linear line L1 shown in FIG. 7, where T is a temperature in a unit of Kelvin and P denotes a pressure in a unit of Pascal. Parameters, A, B, and C are constants of −10.1 (K), −10.1 (K), 12.5, and 1.00 Pa, respectively.

$$10^3 \cdot A/T_C + B = \log_{10}(P/C) \quad (1)$$

In the step S25 to raise the temperature in the furnace under the first pressure, the dissociation of nitrogen ($N_2$) is accelerated at an instant when the temperature reaches a critical temperature $T_c$ corresponding to the equilibrium condition L1. Accordingly, in order to suppress the dissociation of nitrogen, it becomes important and inevitable to set the elapsed time short as possible, where the elapsed time is measured from the instant when the temperature in the furnace reaches the critical temperature $T_C$ above to an instant to begin the deposition of the SiN film 3.

Figure 9:
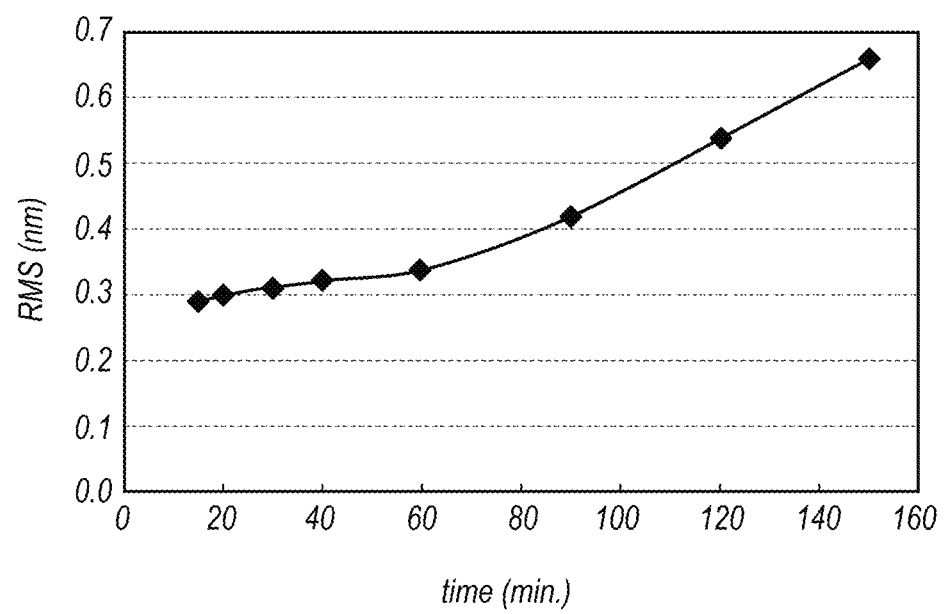
FIG. 9 shows the surface roughness of the epitaxial substrate against the elapsed time from an instant when the temperature of the furnace reaches the critical temperature to the supply of di-chloro-silane ($SiH_2Cl_2$)

FIG. 9 shows the surface roughness of the epitaxial substrate 9 in the unit of RMS against the elapsed time during which the epitaxial substrate 9 is exposed under the severe conditions of a high temperature higher than the critical temperature and a low pressure. The surface roughness RMS of the epitaxial substrate 9 is investigated by the atomic force microscope (AFM) after removing the deposited SiN film 3 by fluoric acid (HF). In obtaining the result shown in FIG. 9, the epitaxial substrate 9 is loaded into the furnace at 500° C. Referring to FIG. 9, the surface roughness RMS monotonically decreases as the elapsed time becomes shorter. Specifically, the elapsed time shorter than 90 minutes results in the surface roughness smaller than 0.41 nm. The surface roughness smaller than 0.34 nm may be obtained for the elapsed time shorter than 60 minutes, and the surface roughness smaller than 0.30 nm may be obtained for the elapsed time shorter than 30 minutes.

Accordingly, the process according to the present embodiment preferably begins the deposition of the SiN film 3 within 60 minutes after the temperature in the furnace 5 reaches the critical temperature determined by the first pressure described above. Taking the step S26 into account, where the step S26 iterates the exhaustion of the furnace to a pressure smaller than 10 Pa and the supply of ammonia ($NH_3$) therein; the process further preferably begins the deposition of the SiN film 3 within 30 minutes after the temperature in the furnace reaches the critical temperature.

Figure 10A:
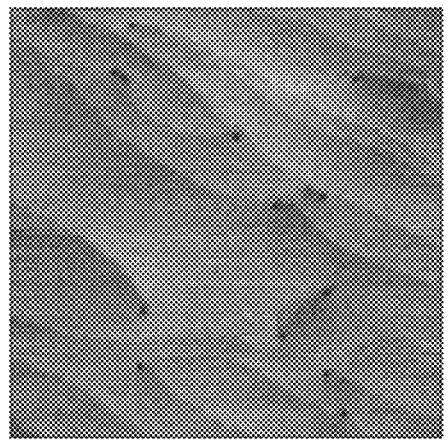
FIG. 10A to FIG. 10C show surface morphologies of the nitride semiconductor layer investigated through an atomic force microscope (AFM) technique.
Figure 10B:
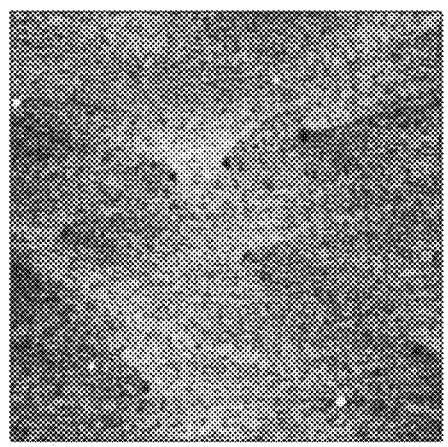
Figure 10C:
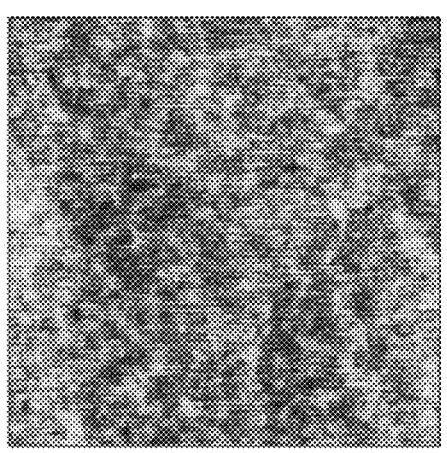

FIG. 10A to FIG. 10C show morphologies of the surfaces of the nitride semiconductor layer 5 in an area of 1 μm×1 μm, which are taken by the AFM technique, where FIG. 10A to FIG. 10C correspond to the surface roughness of smaller than 0.35 nm, 0.35 to 0.50 nm, and greater than 0.50 nm, respectively. The nitride semiconductor layer 5 may have the surface roughness shown in FIG. 10A before the SiN film 3 is deposited thereon. FIG. 10A clearly shows steps formed by atomic layers and several defects probably due to dislocations. When the surface roughness RMS exceeds, for instance, 0.35 nm; the surface of the nitride semiconductor layer 5 causes pits probably due to the dissociation of nitrogen ($N_2$), as shown in FIG. 10B. Further, when the surface roughness RMS exceeds 0.5 nm, as shown in FIG. 10C, the surface no longer shows steps formed by atomic layers, instead, a huge number of pits by the dissociation of nitrogen ($N_2$) appear. Pits appearing in FIG. 10B have diameters of 5 to 20 nm and depths of 0.5 to 2 nm, while, the pits observed in FIG. 10C not only increase the number thereof but also expand dimensions.

As described above, setting the elapsed time shorter than 60 minutes, the surface roughness RMS may be smaller than 0.34 nm, which means that such a shortened elapsed time may result in a smooth surface like that shown in FIG. 10A. Also, setting the first pressure, namely, the pressure in the furnace during the temperature rise, to be greater than 30 kPa, the surface roughness of the semiconductor layer 5 reduces to that smaller than 0.32 nm, which means that the nitride semiconductor layer 5 with an enough smooth surface may be obtained. Also, when the loading temperature $T_{LOAD}$ is set lower than 500° C., the surface roughness RMS of the nitride semiconductor layer 5 reduces to 0.32 nm, which brings a smooth surface in the nitride semiconductor layer 5.

The nitride semiconductor layer 5 is exposed in severe conditions of the deposition temperature and the second pressure during the conversion of the atmosphere in the furnace from nitrogen ($N_2$) to ammonia ($NH_3$) in the step S26. Accordingly, the process is necessary to set the elapsed time as short as possible, preferably shorter than 20 minutes. A shortened elapsed time during the step S26 may bring a smoothed surface of the nitride semiconductor layer 5.

The second temperature at which the deposition is carried out may be lower than 900° C., which may suppress unnecessarily degraded surface quality in the nitride semiconductor layer 5.

The step S26 iterates the exhaustion of the furnace to a pressure lower than 10 Pa and the supply of ammonia ($NH_3$). The conversion of the atmosphere in a furnace generally exhausts the furnace to a pressure smaller than 1 Pa, then, supplies ammonia ($NH_3$) in the furnace to a pressure of 1 to 10 Pa. However, a condition of a pressure smaller than 1 Pa at a high temperature may accelerate degradation of surface quality of a semiconductor layer. Accordingly, the conversion of the atmosphere according to the present embodiment iterates the exhaustion of the furnace to a pressure of 1 to 10 Pa without entering a range less than 1 Pa, and the supply of ammonia ($NH_3$) several times.

Also, the deposition of the SiN film 3 may be carried out as setting supply amount of di-chloro-silane ($SiH_2Cl_2$) and ammonia ($NH_3$) equal to each other. The step S27, where the process converts the atmosphere in the furnace to nitrogen ($N_2$) from a mixture of ammonia ($NH_3$) and di-chloro-silane ($SiH_2Cl_2$), may be carried out at the deposition temperature before the temperature is fallen. Chlorine ($Cl_2$) contained in $SiH_2Cl_2$ is preferably exhausted from the furnace as prompt as possible. When the conversion of the atmosphere to nitrogen ($N_2$) is carried out after the temperature is fallen, the ammonia ($NH_3$) atmosphere in the furnace may further suppress the surface degradation of the nitride semiconductor layer 5. The ammonia ($NH_3$) atmosphere may suppress the dissociation of nitrogen atoms from the SiN film 3, which may also suppress diffusion of nitrogen ($N_2$) from the nitride semiconductor layer 5 to the SiN film 3.

Also, the step S25 of raising the temperature in the furnace may carry out the leak check of the furnace. The leak check investigates air-tightness of the furnace after exhausting the furnace and shutting down all supply lines. The leak check is generally carried out at a high temperature after the step S25, because the check at a high temperature may enhance reliability thereof. The present embodiment performs the leak check at the step S24 before raising the temperature, or at the step S25 but before the temperature of the furnace reaches the critical temperature $T_C$ defined by the equation (1) above described. Those sequences for the leak check may shorten the elapsed time during which the epitaxial substrate is exposed under the severe conditions.

Also, the step S25 raises the temperature in the furnace to the second temperature, namely, the deposition temperature, but, the temperature in the furnace gradually reaches the second temperature at the end of the step S25. Accordingly, the step S26 to convert the atmosphere may begin the exhaustion at an instant when the temperature in the furnace reaches a tentative temperature that is lower than the second temperature in Celsius by 10% of a difference between the second temperature and the first temperature. The conversion to ammonia ($NH_3$) including the exhaustion and the supply may be carried out during the final rise of the temperature to the second temperature, and the elapsed time may be shortened.

Third Embodiment

Next, a process of forming a nitride semiconductor device is described as the third embodiment of the present invention, where the nitride semiconductor device provides the SiN passivation film 3. FIG. 11A to FIG. 13B are cross sectional views of the semiconductor device at respective steps of the process. Although the third embodiment concentrates a semiconductor device type of high electron mobility transistor (HEMT) primarily made of nitride semiconductor materials, typically gallium nitride (GaN); the process of the third embodiment may be applicable to other types of semiconductor devices and made of other semiconductor materials.

Figure 11A:
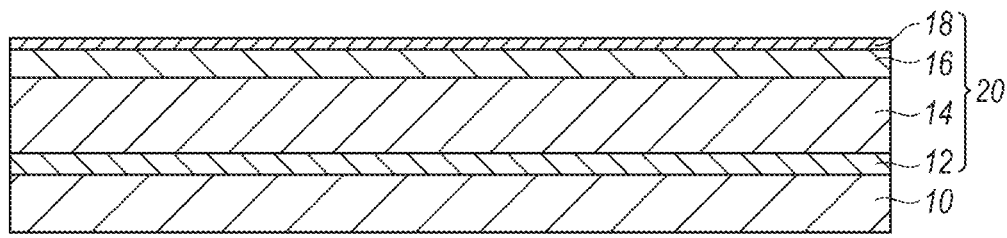
FIG. 11A to FIG. 11C are cross sectional views of a semiconductor device at respective steps of a process of forming the semiconductor device according to the third embodiment of the present invention.

The process of the embodiment first forms a semiconductor stack 20 on a substrate 10, as shown in FIG. 11A. The substrate 10 may be made of silicon carbide (SiC) with a primary surface thereof, on which the semiconductor stack 20 is grown, having a surface orientation (0001). Accordingly, the semiconductor stack 20 has a stacking direction along a crystal orientation [0001]. The semiconductor stack includes, from the side of the substrate 10, a nucleus forming layer 12, a channel layer 14, a barrier layer 16, and a cap layer 18. The nucleus forming layer 12 may be made of aluminum nitride (AlN) with a thickness of scores of nanometers. The channel layer 14 may be made of undoped gallium nitride (GaN) layer with a thickness of around 1 µm. The barrier layer 16, which may be made of n-type aluminum gallium nitride (n-AlGaN), has a thickness of 20 nm. The cap layer 18 may be made of n-type GaN with a thickness of 5 nm.

Figure 11B:
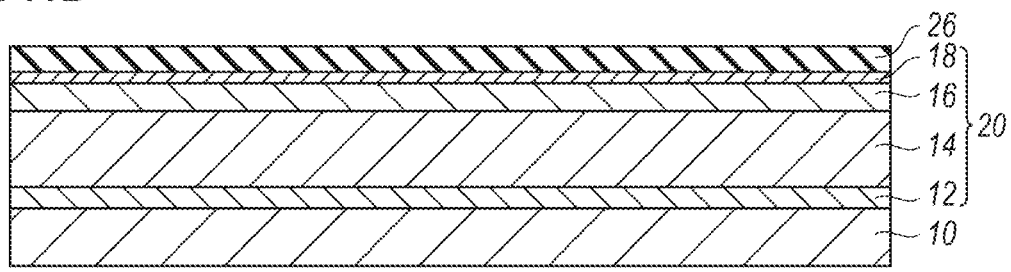

Thereafter, the process deposits the SiN passivation film 26 on the semiconductor stack 20 by the LPCVD technique, as shown in FIG. 11B. Details of the depositing process for the SiN passivation film 26 are substantially same with those of the aforementioned processes in the first and the second embodiment. The deposition temperature of the SiN passivation film 26 is set to be, for instance, 800° C. Di-chlorosilane ($SiH_2Cl_2$) and ammonia ($NH_3$) are used as the source gases for silicon (Si) and nitrogen ($N_2$). The SiN passivation film 26 may have a thickness around 100 nm.

Figure 11C:
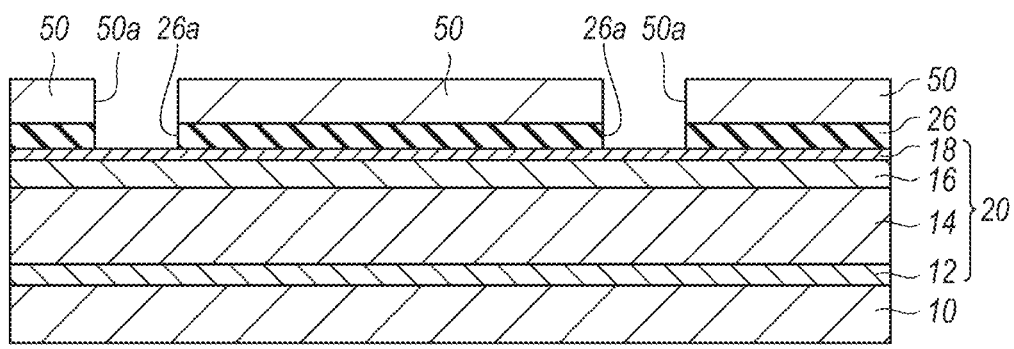

Thereafter, a photolithography may form a patterned photoresist 50 on the SiN passivation film 26, as shown in FIG. 11C. The patterned photoresist 50 provides openings 50a in positions where electrodes of a source and a drain are to be formed. A reactive ion etching (RIE) using a reaction gas containing fluorine (F) may form the openings 26a in the SiN passivation film 26, where the openings 26a reflect the openings 50a in the photoresist.

Figure 12A:
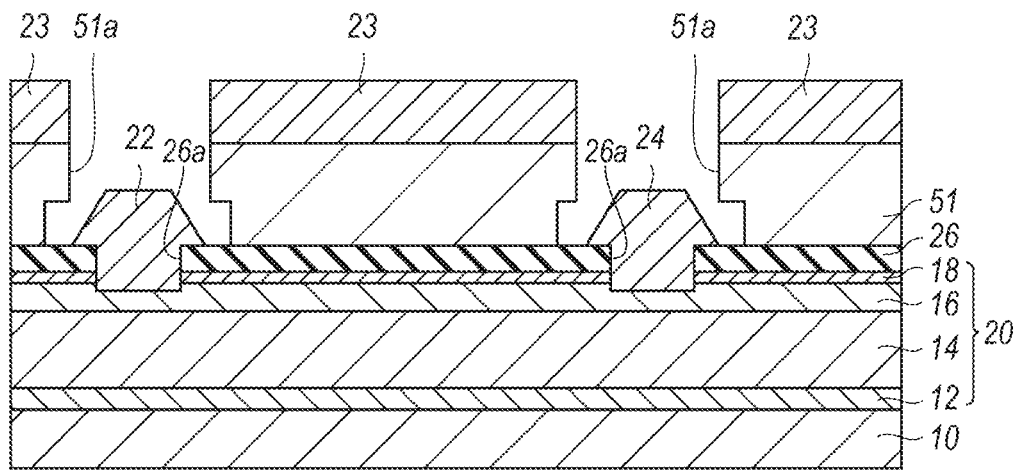
FIG. 12A and FIG. 12B are cross sectional views of the semiconductor device at respective steps of the process subsequent to the step shown in FIG. 11C.

Thereafter, the photolithography may form another patterned photoresist 51 on the SiN passivation film 26, where the other photoresist 51 also provides openings 51a that fully cover the openings 26a formed in the SiN passivation film 26, as shown in FIG. 12A. That is, the surface of the semiconductor stack 20 exposed within the openings 26a in the SiN passivation film 26 is fully exposed within the openings 51a in the photoresist 51. The openings 51a expose the surface of the SiN passivation film 26 and the openings 26a in the SiN passivation film 26 that expose the surface of the semiconductor stack 20 therein. The RIE process using a reactive gas containing chlorine ($Cl_2$) may etch the semiconductor stack 20 exposed within the openings 26a in the passivation film 26. That is, the cap layer 18 exposed within the openings 26a and a portion of the barrier layer 16 also in the openings 26a may be etched by the RIE process. During the RIE process using chlorine gas, the surface of the SiN passivation film 26 in peripheries of the openings 26a thereof are exposed to chlorine plasma.

Thereafter, the electrodes of the source 22 and the drain 24 are formed by, for instance, a metal evaporation and a lift-off technique carried out subsequent to the metal evaporation for metals so as to be in contact with the barrier layer 16 through the openings 26a in the SiN passivation film 26. Specifically, the metal evaporation deposits stacked metals of titanium (Ti) with a thickness of 30 nm and aluminum (Al) with a thickness of 300 nm. In an alternative, tantalum (Ta) may be replaced from Ti. The metal evaporation may deposit residual metals 23 on the mask 51; but the lift-off technique to solve the mask 51 with solvent may remove the residual metals 23 on the mask 51. Alloying the stacked metals left within the openings 26a and on the SiN passivation film 26 at a temperature around 500° C., the electrodes of the source 22 and the drain 24 may be formed. Alloying temperature higher than 550° C. may be effective for reduction contact resistance of the electrodes, 22 and 24.

Figure 12B:
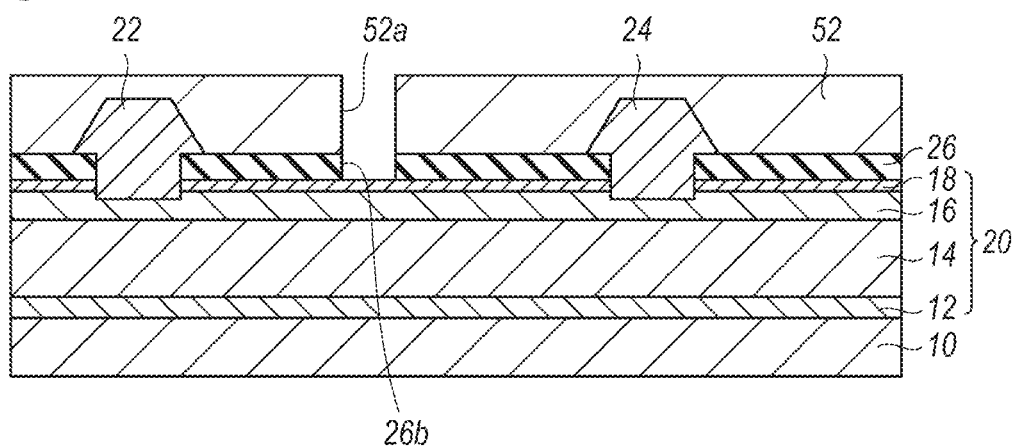

Thereafter, the photolithography may prepare another patterned photoresist 52 on the semiconductor stack 20, as shown in FIG. 12B, where the patterned photoresist 52 provides an opening 52a in a position where the gate electrode 28 is to be formed. The RIE process using the patterned photoresist 52 as a mask may form a gate opening 26b in the SiN passivation film 26. The patterned photoresist 52 is removed after the RIE process.

Figure 13A:
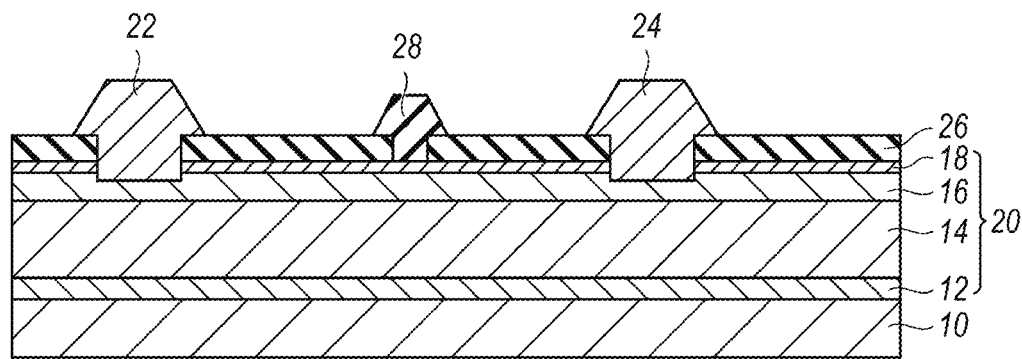
FIG. 13A and FIG. 13B are cross sectional views of the semiconductor device at respective steps of the process subsequent to the step shown in FIG. 12C.

Thereafter, the photolithography may form another patterned photoresist on the insulating film 26, which is not illustrated in the figures. The other patterned photoresist provides an opening corresponding to a gate metal; that is, the opening in the other pattered photoresist fully overlaps with the gate opening 26b in the SiN passivation film 26. Evaporating stacked metals of nickel (Ni) and gold (Au) so as to be in contact with the cap layer 18 through the gate opening 26b, and performing the lift-off process to remove residual metals deposited on the other patterned photoresist, the gate electrode with a T-shaped cross section may be formed as shown in FIG. 13A. Nickel (Ni), which has a thickness around 50 nm, makes a Schottky contact with the cap layer 18; while, gold (Au) may reduce the gate resistance and have a thickness around 400 nm.

Figure 13B:
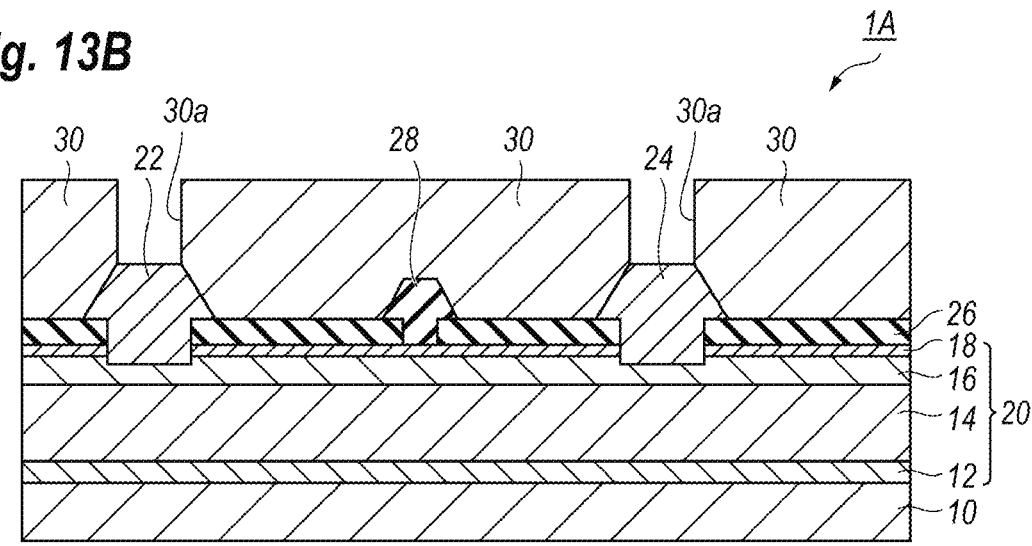

Thereafter, as shown in FIG. 13B, another insulating film 30 is deposited on the electrodes of the source 22, the drain 24, and the gate 28, and on the SiN passivation film 26 exposed between the electrodes, 22 to 28. The insulating film 30 may have a thickness of, for instance, 500 nm and may be made of SiN. Forming openings 30a so as to expose tops of the electrodes of the source 22 and the gate 24, the process of forming the HEMT 1A according to the present embodiment may be completed.

According to the process thus described, the SiN passivation film 26, which is deposited by the LPCVD technique with the sequence shown in FIG. 2, may suppress the degradation of the surface quality of the semiconductor stack 20, namely, the surface of the cap layer 18.

Figure 14:
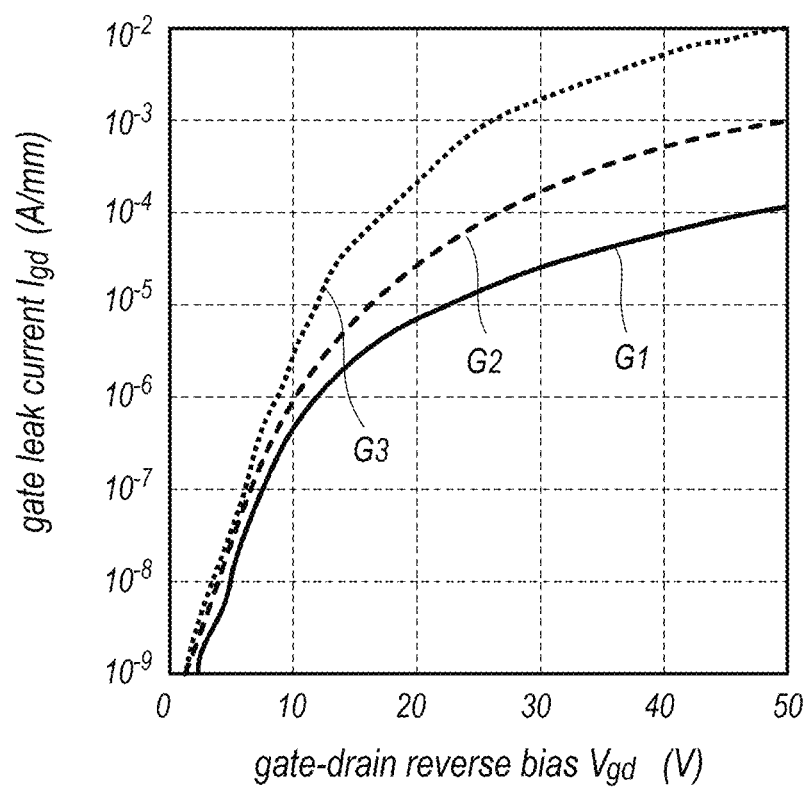
FIG. 14 shows gate leak currents against the reversed gate-drain biases for HEMTs having SiN passivation films formed by various conditions.

FIG. 14 shows behaviors of the gate leak current measured for the HEMT 1A under conditions where the source thereof was floated, namely, connected with nowhere, and reverse bias were supplied between the gate and the drain. Behaviors, G1 to G3, were obtained for the SiN passivation film 26 deposited by conditions in the following table. The HEMTs used in the measurements had dimensions of a source-drain length $L_{DS}$ of 7.2, a gate-source length $L_{GS}$ of 1.4 µm, a gate-drain length $L_{GD}$ of 5.2 µm, a gate length $L_G$ of 0.6 µm, and a gate width $W_G$ of 500 µm.

TABLE I

|  | G1 | G2 | G3 |
| --- | --- | --- | --- |
| Loading Temperature $T_{LOAD}$ (° C.) | 400 | 600 | 600 |
| first pressure (Pa) | 100k | 3k | 30 |
| waiting time (minutes) | 5 | 30 | 30 |
| surface roughness RMS (nm) | 0.27 | 0.45 | 0.77 |
| gate leak current @ 50 V (/mm) | 0.1 mA | 1.0 mA | 9.8 mA |

As the table above clearly shows, the condition G1 may remarkably suppress the surface roughness RMS of the semiconductor stack 20 compared with the other conditions, G2 and G3, where the condition G1 sets the loading temperature of 400° C., the first pressure in the furnace during the temperature rise of 100 kPa, namely, almost air pressure, and the elapsed time from the first exhaustion to the supply of $SiH_2Cl_2$ of 5 minutes. The gate leak current becomes smaller as the surface roughness RMS becomes smaller as clearly shown in FIG. 14.

Table II below summarizes the result for the second embodiment, that is, the surface roughness RMS was measure with respect to the elapsed time from the instant when the temperature reaches the critical temperature $T_C$ attributed to the first pressure of nitrogen ($N_2$) to the beginning of the deposition by supplying di-chloro-silane ($SiH_2Cl_2$). As Table II below clearly shows, the surface roughness RMS and the gate leak current remarkably decreases when the elapsed time was set to be 15 minutes and the loading temperature $T_{LOAD}$ was set to be 400° C.; while, the conditions of 600° C. in the loading temperature $T_{LOAD}$ and 90 minutes in the elapsed time shows considerably degraded surface roughness RMS (=0.55 nm) and gate leak current (=7.1 mA).

TABLE II

|  | G1' | G2' | G3' |
|---|---|---|---|
| Loading Temperature $T_{LOAD}$ (° C.) | 400 | 400 | 600 |
| exposure time (minutes) | 15 | 90 | 90 |
| surface roughness RMS (nm) | 0.29 | 0.42 | 0.55 |
| gate leak current @ 50 V (/mm) | 0.15 mA | 0.95 mA | 7.1 mA |

While particular embodiment of the present invention has been described herein for purposes of illustration, many modifications and changes will become apparent to those skilled in the art. For instance, embodiment thus described may be combined to each other depending on necessary subjects and expected functions. Also, the third embodiment concentrates on an electron device type of HEMT; the spirits and scopes of the present invention may be applicable to other type of electron devices. Accordingly, the appended claims are intended to encompass all such modifications and changes as fall within the true spirit and scope of this invention.

What is claimed is:

1. A process of depositing a silicon nitride (SiN) film on a nitride semiconductor layer, the process comprising steps of:
   loading an epitaxial substrate including the nitride semiconductor layer within a furnace at a first temperature lower than 500° C.;
   converting an atmosphere in the furnace from air to nitrogen ($N_2$), and after the converting, setting a pressure of the $N_2$ in the furnace to a first pressure that is higher than 30 kPa and lower than 100 kPa;
   raising the temperature in the furnace to a second temperature higher than 750° C. while keeping the pressure within the furnace at the first pressure;
   converting the atmosphere in the furnace from nitrogen ($N_2$) to ammonia ($NH_3$) within 20 minutes;
   setting the pressure in the furnace to a second pressure lower than 100 Pa; and
   depositing the SiN film by supplying di-chloro-silane ($SiH_2Cl_2$) and ammonia ($NH_3$).

2. The process according to claim 1,
   wherein the second temperature is lower than 900° C.

3. The process according to claim 1,
   wherein the step of converting the atmosphere to ammonia ($NH_3$) iterates steps of
   exhausting the furnace to a pressure lower than 20 Pa but higher than 1 Pa; and
   supplying ammonia ($NH_3$).

4. The process according to claim 1,
   wherein the step of depositing the SiN film supplies $SiH_2Cl_2$ and ammonia at supply amounts equal to each other.

5. The process according to claim 1,
   further including, after the step of converting the atmosphere from the air to nitrogen ($N_2$) but before the step of raising the temperature in the furnace to the second temperature, a step of checking air-tightness in the furnace.

6. The process according to claim 1,
   further includes, after the step of depositing the SiN film, steps of:
   interrupting supply of di-chloro-silane;
   setting the temperature in the furnace lower than the second temperature; and
   converting the atmosphere in the furnace from ammonia ($NH_3$) to nitrogen ($N_2$).

7. The process according to claim 1,
   wherein the step of converting the atmosphere to ammonia ($NH_3$) begins at a tentative temperature that is lower than the second temperature by 10% of a difference between the second temperature and the first temperature.

8. A process of forming a passivation film made of silicon nitride (SiN) on a nitride semiconductor layer, the process comprising steps of:
   loading an epitaxial substrate that includes the nitride semiconductor layer within a furnace at a first temperature;
   converting an atmosphere in the furnace from air to nitrogen ($N_2$), and after the converting, setting a pressure of the $N_2$ in the furnace to be a first pressure;
   raising the temperature of the furnace to a second temperature higher than 700° C.;
   converting the atmosphere in the furnace to ammonia ($NH_3$); and
   supplying di-chloro-silane ($SiH_2Cl_2$) within the furnace to begin the deposition of the passivation film on the nitride semiconductor layer,
   wherein the step of raising the temperature and the step of converting the atmosphere to $NH_3$ set an elapsed time to be shorter than 60 minutes, the elapsed time being measured from an instant when the temperature in the furnace reaches a critical temperature $T_C$ defined by an equation:

$$10^3 \cdot A/T_C + B = \log_{10}(P/C),$$

to a beginning of the deposition, where P is the first pressure in units of Pascal (Pa), $T_C$ is the critical temperature in units of Kelvin (K), and A to C are, −10 (K) 12.5, and 1.00 Pa, respectively.

9. The process according to claim 8,
   wherein the first temperature is 500° C. or lower.

10. The process according to claim 8, further including, after the step of performing the converting to nitrogen ($N_2$) but before the step of raising the temperature in the furnace, a step of checking air-tightness of the furnace.

11. The process according to claim 8,
    wherein the step of converting the atmosphere to ammonia ($NH_3$) begins at a tentative temperature that is lower than the second temperature by 10% of a difference between the second temperature and the first temperature.

12. The process according to claim 8,
    wherein the step of converting the atmosphere to ammonia ($NH_3$) iterates steps of:
    exhausting the furnace to a pressure of 1 to 10 Pa, and
    supplying ammonia ($NH_3$).

13. The process according to claim 8, wherein the second temperature is lower than 900° C.

14. The process according to claim 8,
wherein the step of supplying $SiH_2Cl_2$ sets supply amounts of $SiH_2Cl_2$ and $NH_3$ equal to each other.

\* \* \* \* \*